(12) United States Patent
Potanin et al.

(10) Patent No.: US 7,061,210 B1
(45) Date of Patent: Jun. 13, 2006

(54) CONTROLLABLE CURRENT TRIP-POINT DETECTION CIRCUIT

(75) Inventors: Vladislav Potanin, San Jose, CA (US); Elena Potanina, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 486 days.

(21) Appl. No.: 10/421,004

(22) Filed: Apr. 21, 2003

(51) Int. Cl.
*H02J 7/00* (2006.01)

(52) U.S. Cl. ........................................ 320/160

(58) Field of Classification Search ........ 320/148–149, 320/157–159, 161–164; 323/271, 274, 275, 323/277, 282, 284, 285; 327/62, 538, 543; 361/56–58
See application file for complete search history.

(56) References Cited

U.S. PATENT DOCUMENTS

| | | | |
|---|---|---|---|
| 5,554,921 A * | 9/1996 | Li et al. | 320/106 |
| 5,691,624 A | 11/1997 | Im et al. | 320/48 |
| 6,014,030 A | 1/2000 | Smith et al. | 324/705 |
| 6,064,181 A | 5/2000 | Sanada et al. | 320/132 |
| 6,127,882 A | 10/2000 | Vargha et al. | 327/540 |
| 6,456,051 B1 * | 9/2002 | Darzy | 323/284 |
| 6,479,975 B1 | 11/2002 | Plankensteiner et al. | 323/316 |

* cited by examiner

*Primary Examiner*—Adolf Deneke Berhane
*Assistant Examiner*—Robert T. Dang
(74) *Attorney, Agent, or Firm*—Brett A. Hertzberg; Merchant & Gould P.C.

(57) ABSTRACT

A current trip point detection circuit includes a transistor, a series of resistors, an amplifier, a comparator, and a series of switching circuits. The first transistor and the resistors are configured as an inverting gain stage. The amplifier cooperates with the first transistor to operate in a negative feedback arrangement. The gain in the feedback loop is adjusted by selective activation of additional transistors, where each additional transistor lowers the overall loop gain. The comparator is selectively coupled to a tap point in a voltage divider that is formed by resistors. The voltage divider tap point is selected to set a threshold for detection. The trip point is detected by the comparator, and may be adjusted between high and low trip points through the various configurations of the gain and voltage divider tap points via the switching circuits.

20 Claims, 3 Drawing Sheets

CONTROLLABLE CURRENT TRIP-POINT DETECTION CIRCUIT

FIELD OF THE INVENTION

The present invention is related to current trip-point detection. More particularly, the present invention is related to a circuit that asserts a detection signal when the sensed current reaches a selected trip-point level. A gain factor and a threshold level associated with the sensed current is adjustable via control signals. The selected trip-point level may be used to detect the end of a charging cycle in a battery charger application.

BACKGROUND OF THE INVENTION

Demand for portable electronic devices is increasing each year. Example portable electronic devices include: laptop computers, personal data assistants (PDAs), cellular telephones, and electronic pagers. Portable electronic devices place high importance on total weight, size, and battery life for the devices.

Most portable electronic devices employ rechargeable batteries. Commonly used rechargeable batteries include Nickel-Cadmium (NiCad), Nickel-Metal-Hydride (NiMHi), Lithium-Ion (Li-Ion), and Lithium-Polymer based technologies. Charger circuits are commonly available for each of these types of battery technologies. Each charger circuit includes a shunt regulator to control the amount of charge that is delivered to the battery.

An example shunt regulator charging system is shown in FIG. 1. As shown in FIG. 1, the shunt regulator charging system includes a power source (PS), a shunt regulator (102), and a rechargeable battery (BATT). The power source (PS) includes a voltage source (VS) and a source resistance (RS). The shunt regulator (102) includes a NMOS transistor (MN), a PMOS transistor (MP), an amplifier (AMP), and three resistors (R1–R3).

In operation the power source provides a charging current (I) to the lithium battery through source resistance RS, PMOS transistor MP, and resistor R3. Resistor R3 converts the charging current (I) into a voltage (VSNS), which is used by other circuitry (not shown) to control the activation of transistor MP. PMOS transistor MP is activated during normal charging operations. Resistors R1 and R2 form a voltage divider that provide a feedback signal to amplifier AMP. Amplifier AMP compares the feedback signal to a reference voltage (VREF) and provides a control signal to transistor MN. Transistor MN, amplifier AMP, and resistors R1–R2 together operate as a shunt regulator that regulates the input voltage (VIN). The shunt regulator provides safe charging of lithium battery BATT by limiting the charging voltage (input voltage) similar to a zener diode.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1:
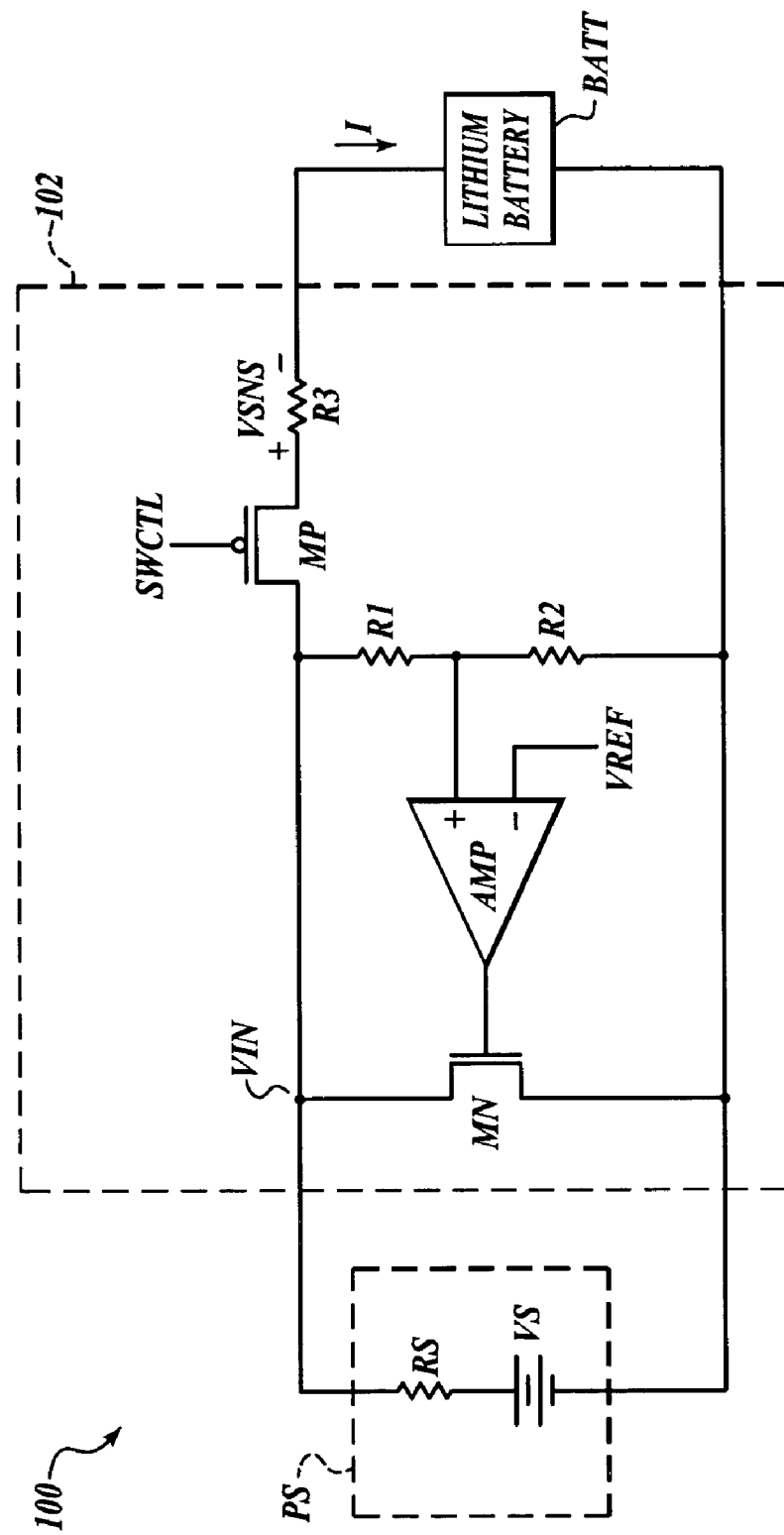
FIG. 1 is an illustration of a schematic diagram for a conventional shunt regulator.

Throughout the specification and claims, the following terms take the meanings explicitly associated herein, unless the context clearly dictates otherwise. The meaning of "a," "an," and "the" includes plural reference. The meaning of "in" includes "in" and "on." The term "connected" means a direct connection between the items connected, without any intermediate devices. The term "coupled" refers to both direct connections between the items connected, and indirect connections through one or more intermediary items. The term "circuit" may refer to both single components, and to a multiplicity of components. The term component refers to one or more items that are configured to provide a desired function. The term "signal" includes signals such as currents, voltages, charges, logic signals, data signals, optical signals, electromagnetic waves, as well as others. Referring to the drawings, like numbers indicate like parts throughout the views.

System Overview

Briefly stated, the present invention is related to a current trip point detection circuit that includes a transistor, a series of resistors, an amplifier, a comparator, and a series of switching circuits. The first transistor and the resistors are configured as an inverting gain stage. The amplifier cooperates with the first transistor to operate in a negative feedback arrangement. The gain in the feedback loop is adjusted by selective activation of additional transistors, where each additional transistor lowers the overall loop gain. The comparator is selectively coupled to a tap point in a voltage divider that is formed by resistors. The voltage divider tap point is selected to set a threshold for detection. The trip point is detected by the comparator, and may be adjusted between high and low trip points through the various configurations of the gain and voltage divider tap points via the switching circuits.

Figure 2:
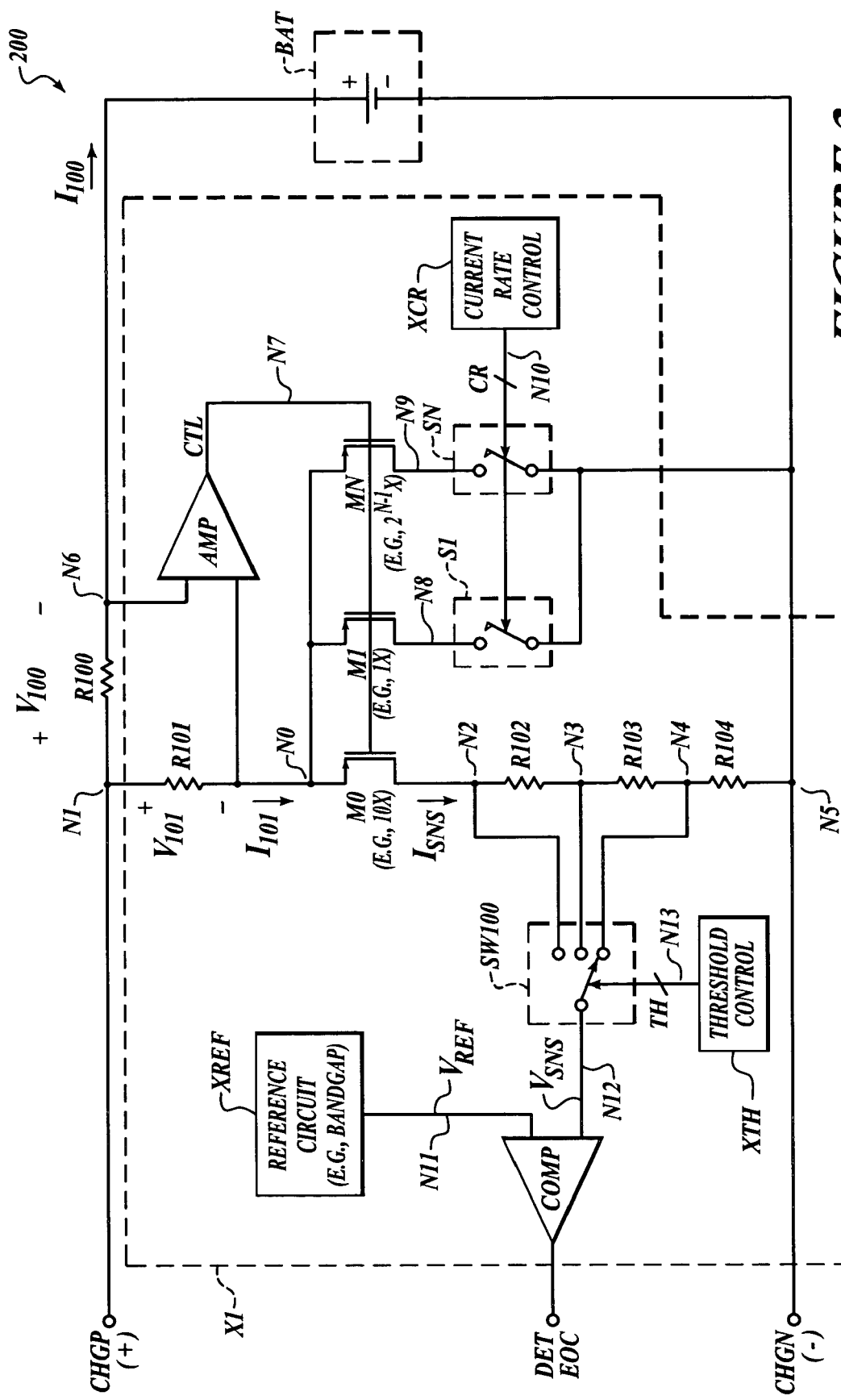
FIG. 2 is an illustration of a schematic diagram for a current trip-point detection circuit that is arranged according to an embodiment of the present invention.

FIG. 2 is an illustration of a schematic diagram (200) for a current trip-point detection circuit (X1) that is arranged according to an embodiment of the present invention. Current trip-point detection circuit X1 includes a reference circuit (XREF), a comparator (COMP), an amplifier (AMP), a threshold control circuit (XTH), a current rate control circuit (XCR), four resistors (R101–R104), three switching circuits (SW100, S1, SN) and three transistors (M0, M1, MN). Current trip point detection circuit X1 is arranged in cooperation with another resistor (R100), and a load circuit such as, for example, a rechargeable battery (BAT).

The reference circuit (XREF) is coupled to node N11, and arranged to provide a reference voltage (VREF). Reference circuit XREF can be any reference voltage generator including, but not limited to, a bandgap circuit. The comparator (COMP) includes an input that is coupled to node N11, another input that is coupled to node N12, and an output that is arranged to provide a detection signal (DET). Threshold control circuit XTH is coupled to node N13, and arranged to provide a threshold control signal (TH). The switching circuit (SW100) is arranged to selectively couple one of nodes N2, N3 and N4 to node N12 in response to threshold control signal TH. Resistor R100 is coupled between nodes N1 and N6. Resistor R101 is coupled between nodes N1 and N0. Resistor R102 is coupled between nodes N2 and N3. Resistor R103 is coupled between nodes N3 and N4. Resistor R104 is coupled between node N4 and node N5. Rechargeable battery BAT is coupled between nodes N5 and N6. Amplifier AMP includes an input that is coupled to node N0, another input that is coupled to node N6, and an output that is coupled to node N7. Transistor M0 includes a source that is coupled to node N0, a gate that is coupled to node N7, and a drain that is coupled to node N2. Transistor M1 includes a source that is coupled to node N0, a gate that is coupled to node N7, and a drain that is coupled to node N8. Transistor MN includes a source that is coupled to node N0, a gate that is coupled to node N7, and a drain that is coupled to node N9. Current rate control circuit XCR is arranged to provide a current rate control signal (CR) to node N10. Switching circuit S1 is arranged to selectively couple node N8 to node N5 in response to current rate control signal CR. Switching circuit SN is arranged to selectively couple node N9 to node N5 in response to current rate control signal CR.

General Operation

In operation, an external power source may be coupled between nodes N1 and N5 to apply power to the load circuit (e.g., rechargeable battery BAT). Node N1 corresponds to a positive supply signal (CHGP), while node N5 corresponds to a negative supply signal (CHGN). Current (I100) is delivered to the load circuit via resistor R100. Additional circuitry (not shown) may be supplied to provide further regulation of the external power source (e.g., shunt regulation, current limiting, etc.)

A voltage (V100) develops across resistor R100 as the current (I100) is delivered to the load (e.g., rechargeable battery BAT). Amplifier AMP is arranged to sense the voltages across resistors R100 and R101. Transistor M0 and resistors R102–R104 are arranged as an inverting gain stage. The gain associated with the inverting gain stage is adjusted by selective activation of transistors M1–MN. Amplifier AMP and resistor R101 cooperate with the inverting gain stage to form a negative feedback loop. The voltage (V101) across resistor R101 is matched to the voltage (V100) across resistor R100 by the negative feedback loop. The current (I101) through resistor R101 is given by the following expression: I101=I100*R100/R101.

Current I101 is coupled to an input terminal (e.g., the source terminal) of transistors M0–MN. Transistors M0–MN divide current I101 into two portions, a sense current (ISNS) and a shunt current (ISH). The sense current (ISNS) corresponds to the operating current of transistor M0. The shunt current (ISH) corresponds to the operating currents of the transistors (M1–MN), which are selectively activated via the switching circuits (S1–SN). Current rate control circuit XCR selectively activates the switching circuits (S1–SN) such that the apportionment between the shunt current (ISH) and the sense current (ISNS) is adjustable (ISNS+ISH=I101). In other words, the current gain (G1) between currents I101 and ISNS may be changed by selective activation of transistors M0–MN via switching circuits S1–SN, where the sense current is given by: ISNS=I101*G1=I100*(R100/R101)*G1.

Each of the selected transistors (M0–MN) is configured to operate with the same gate-source voltage such that the division between ISNS and ISH is distributed according to their relative sizes. In one embodiment, transistors M1–MN are equally sized such that each additionally activated transistor reduces the gain between I101 and ISNS by a linear amount. In another embodiment, transistors M1–MN are not equally sized such that each additionally activated transistor reduces the gain between I101 and ISNS by a step size amount. In still another embodiment, transistors M1–MN have binary-scaled sizes such that the current division (or the current gain) is scaled in binary fashion. The current gain (G1) between current I101 and ISNS is determined by the ratio of sizes in the activated transistors (M0–MN). The current gain is equal to once when transistors M1–MN are deactivated, while the current gain is less than one when at least one of transistors M1–MN is activated. The current gain (G1) is generically given by the following expression: G1=1−(X1/X0)−(X2/X0) . . . −(XN/X0), where X0 corresponds to the size of transistor M0, X1 corresponds to the size of transistor M1, and XN corresponds to the size of the Nth transistor (MN).

Resistors R102–R104 form a current to voltage converter that converts the sense current (ISNS) to voltage at node N2. The voltage at node N2 is divided by resistors R102–R104 to form a series of tap points at nodes N2, N3 and N4. The voltage from one of the tap points is selectively coupled to node N12 via switching circuit SW100, which is responsive to threshold control signal TH. The voltage at node N12 corresponds to a sense voltage (VSNS). Comparator circuit COMP is configured to provide a detection signal (DET) that is responsive to the comparison between the sense voltage (VSNS) and the reference voltage (VREF).

The sense voltage is given as: VSNS=ISNS*R104*(1+Y), where Y corresponds to the ratio of the upper resistance from the selected tap point in the voltage divider to resistor R104 (e.g., Y=0, R103/R104, [R103+R102]/R104, etc.). The current-to-voltage gain (G2) is given by: VSNS=ISNS*R104*G2, where G2=1+Y. The overall system gain including the sense current (ISNS) and the sense voltage (VSNS) is expressed as: G=I100*G1*G2=I100*(R100/R101)*G1*G2*R104.

Example Variations

Selective activation of transistor M1–MN is employed to adjust one aspect of the current gain in the system. Control signal CR is arranged to adjust the gain by selective activation of switching circuits S1–SN. The number of switching circuits (e.g., S1 and SN) and corresponding transistors (e.g., M1, MN) is related to number of gain selections that are available in the system. Although FIG. 2 illustrates two transistors (M1 and MN) with two corresponding switching circuits (S1 and SN), any number of transistors and corresponding switching circuits may be employed to adjust the desired granularity for gain control. In one embodiment, four binary weighted transistors are used for transistors M1–MN, where transistor M1 is unit sized, transistor M2 is twice unit sized, etc.

Each of the switching circuits (S1–SN) is illustrated in FIG. 2 as series coupled between the drain of a respective transistor (M1–MN) and node N5 (CHGN) such that each respective transistor may be selectively activated. However, any other switching arrangements may also be employed to as a means for selectively activating transistors M1–MN. For example, the gate of each transistor may be selectively decoupled from amplifier A100 when the gate-source terminals of that transistor are shorted together.

Resistors R102–R104 form a voltage divider as previously described with respect to FIG. 2. Each of the voltage tap points are coupled to the switching circuit (SW100) to provide threshold adjustment of the detection signal. However, any number (e.g., N) of resistors may be employed in place of resistors R102–R104, with a corresponding number of inputs on switching circuit SW100, such that the number of selectable threshold adjustments corresponds is changed. Moreover, the values associated with resistors R102–R104 may be changed relative to one another such that the adjustment in the threshold voltage can be linear, in step increments, binary increments, or any other desired increment.

Control signal TH and CR are arranged to adjust the gain and threshold of the current trip-point detection circuit (X1) by selective activation of switching circuits S1–SN and SW100. In one embodiment, the threshold control circuit is eliminated and the threshold control signal (TH) is provided external from current trip-point detection circuit (X1). In another embodiment, the current rate control circuit (XCR) is eliminated and the current rate control signal (CR) is provided external from current trip-point detection circuit (X1). The control signals (TH, CR) may be provided by any appropriate means including, but not limited to, control signals on a digital signal bus.

Resistor R100 is illustrated in FIG. 2 as an external component with respect to the current trip-point detection circuit (X1). The resistor (R100) can have a low resistance value (e.g., 120 mΩ) such that the resistor (R100) may be implemented as a piece of metal on a printed circuit board (PCB), a piece of metal in the packaging material of an integrated circuit (IC), or some other low resistance material.

EXAMPLE APPLICATION

An example application of a battery charger type of application is illustrated below with reference to FIG. 3. Although the description is related to battery charger applications, the circuit topology may be utilized to generically monitor the load current that is delivered to a load circuit. For the purposes of the discussion that follows below, the load circuit corresponds to rechargeable battery and the detection signal corresponds to an end-of-charge indicator signal.

Rechargeable batteries such as those found in portable electronic devices are recharged with a constant voltage (CV) and constant current (CC) charging scheme. The charger is arranged to operate in either a constant current mode, or a constant voltage mode, depending on the voltage level associated with the rechargeable battery. A constant current is delivered to the rechargeable battery until a predetermined voltage is reached for the battery voltage. After the battery voltage reaches the predefined threshold, the charger system transitions into a constant voltage mode, where a constant voltage is applied to the battery. The current that is delivered to the rechargeable battery begins to fade out as the battery approaches a charged state where the maximum allowable energy has accumulated in the battery. An end of charge signal is provided as an indication that the final battery voltage is achieved.

Rechargeable batteries have a rating that is given in terms of charge total capacity (C), which is usually rate in units of mA*hour. The end of charge (EOC) threshold level is determined as a fraction of the full battery capacity. The EOC threshold level is different for each battery type according to charging conditions that are recommended by the battery manufacturer. Example EOC threshold levels may correspond to 0.1*C, 0.2*C, etc.

Figure 3:
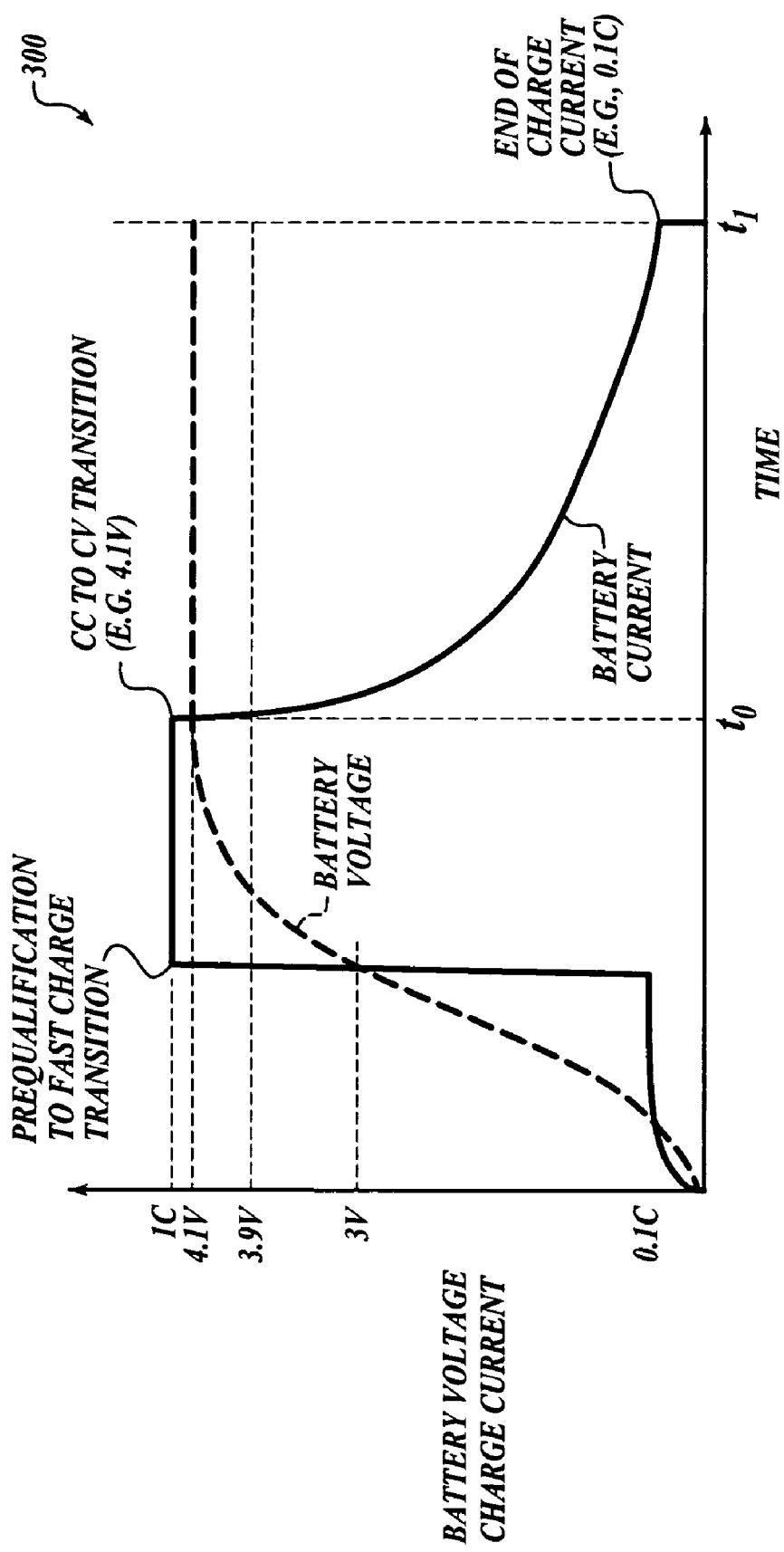
FIG. 3 is an illustration of a transient response for an example current trip-point detection circuit that is arranged according to of an embodiment of the present invention.

As illustrated in FIG. 3, a rechargeable battery is initially charged with a constant current (corresponding to 1*C) until time t0. At time t0, the battery voltage reaches a predefined threshold (e.g., 4.1V) and transitions from constant current to constant voltage mode. At time t1, the battery current reaches the recommended end of charge limit (e.g., 0.1 C) and the battery charging cycle is ended.

In one example circuit, the EOC threshold detection ranges from 0.1*C to 0.2*C. Referring to FIG. 2, the values associated with resistors R102–R104 can be adjusted to accommodate the desired detection range. The detection level is determined by the ratio of the selected resistor values, the load or charging current (I100), the reference voltage (VREF), and the value of resistor R100. The first detection threshold (0.2*C) is adjusted by selecting the ratio of resistors R104 and R101 as: R104/R101=VREF/(I100*R100*0.2). The second detection threshold (0.15*C) is adjusted by selecting the ratio of series combined resistors R104, R103 and R101 as: (R104+R103)/R101=VREF/(I100*R100*0.15). The third detection threshold (0.1*C) is adjusted by selecting the ratio of series combined resistors R104, R103, R102 and R101 as: (R104+R103+R102)/R101=VREF/(I100*R100*0.15). For this example, three different threshold levels can be used by selection of a tap point via switching circuit SW100. Similarly, the sizes associated with transistor M0–MN can be chosen to adjust the charging current rate (e.g., 1*C) as may be desired.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus that is arranged to monitor a load current that is supplied from a power source node to a load node through an external resistor, the apparatus comprising:
   a first resistive circuit, wherein the first resistive circuit includes a first terminal that is coupled to a first node, and a second terminal that is coupled to the power source node;
   a second resistive circuit, wherein the second resistive circuit includes a first terminal that is coupled to a second node, a second terminal that is coupled to a power source return node;
   an amplifier circuit, wherein the amplifier circuit includes a first input that is coupled to the first node, a second input that is coupled to the load node, and an output that is coupled to a feedback node;
   a first transistor circuit, wherein the first transistor circuit includes a first terminal that is coupled to the first node, a second terminal that is coupled to the second node, and a control terminal that is coupled to the feedback node; and
   a second transistor circuit, wherein the second transistor circuit includes a first terminal that is coupled to the first node, a second terminal that is coupled to the power source return node, a control terminal that is coupled to the feedback node, and a selector terminal that is coupled to a selector control node.

2. The apparatus of claim 1, wherein the first resistive circuit, the amplifier circuit, the first transistor circuit, and the second transistor circuit are arranged in a feedback loop such that the voltage across the first resistance circuit (V1) is approximately matched to the voltage across the external resistor (V0) when the load current (I0) is supplied from the power source node to the load node through the external resistor.

3. The apparatus of claim 1, further comprising: a first resistance value (R1) that is associated with the first resistive circuit, a second resistance value (R0) that is associated with the external resistor, and wherein a representative current (I1) is associated with the first resistive circuit (I1) when the load current is supplied from the power source node to the load node through the external resistor, wherein the representative current is approximately given by: I1=I0*R0/R1.

4. The apparatus of claim 1, wherein the first transistor circuit is arranged to provide a sense current from the first node to the second node when the load current is supplied from the power source node to the load node through the external resistor, and wherein the second transistor circuit is arranged to provide a shunt current (ISH) from the first node to the power supply return node when activated in response to a selection control signal that is applied to the selector control node such that the sense current is given by: ISNS=I1−ISH.

5. The apparatus of claim 1, further comprising: a representative current that is associated with the first resistive circuit when the load current is supplied from the power source node to the load node through the external resistor, wherein the first transistor circuit is arranged in cooperation with the second transistor circuit to provide a sense current (ISNS) in response to the representative current (I1) according to a current gain factor (G1) such that the sense current is given by: ISNS=I1*G1.

6. The apparatus of claim 5, wherein the second transistor circuit is arranged for activation when a selection control signal is applied to the selector control node, wherein the current gain factor (G1) is reduced when the second transistor circuit is activated.

7. The apparatus of claim 1, wherein the first transistor circuit includes a first transistor that has a source that is coupled to the first node, and a gate that is coupled to the feedback node, and a drain that is coupled to the second node, and wherein the second transistor circuit includes a second transistor that has a source that is coupled to the first node, a gate that is coupled to the feedback node, and a drain that is selectively coupled to the power source return node when a selection control signal that is applied to the selector control node.

8. The apparatus of claim 1, wherein the first transistor circuit includes a first transistor that has a source that is coupled to the first node, and a gate that is coupled to the feedback node, and a drain that is coupled to the second node, and wherein the second transistor circuit includes a plurality of transistors with corresponding switching circuits, wherein the switching circuits are responsive to a selection signal when applied to the selector control node, wherein each of the plurality of transistors includes a source that is coupled to the first node, a gate that is coupled to the feedback node, and a drain that is selectively coupled to the power supply return node through the corresponding switching circuit.

9. The apparatus of claim 8, wherein each of the plurality of transistors has a size parameter, and wherein the size parameters of each of the plurality of transistors is different from one another in a binary weighted order.

10. The apparatus of claim 1, wherein the first transistor circuit is arranged in cooperation with the second transistor circuit to provide a sense current (ISNS) to the second resistive circuit when the load current is supplied from the power source node to the load node through the external resistor, and wherein the second resistive circuit has an associated resistance value (R2) and is arranged to provide a sense voltage (VSNS) in response to the sense current (ISNS) according to a voltage gain factor (G2) such that the sense voltage (VSNS) is given by: VSNS=ISNS*R2*G2.

11. The apparatus of claim 1, further comprising: a comparator circuit, wherein the comparator circuit includes an output that is coupled to a detection node, a first input that is coupled to a reference voltage node, and a second input that is coupled to a sense node, and wherein the second resistive circuit further comprises a tap point that is coupled to the sense node.

12. An apparatus that is arranged to monitor a load current that is supplied from a power source node to a load node through an external resistor, the apparatus comprising:
a first resistive circuit, wherein the first resistive circuit includes a first terminal that is coupled to a first node, and a second terminal that is coupled to the power source node;
a second resistive circuit wherein the second resistive circuit includes a first terminal that is coupled to a second node, and a second terminal that is coupled to an intermediary node;
a third resistive circuit, wherein the third resistive circuit includes a first terminal that is coupled to the intermediary node, and a second terminal that is coupled to a power source return node;
a switching circuit, wherein the switching circuit includes a first input terminal that is coupled to the second node, a second input terminal that is coupled to the intermediary node, an output terminal that is coupled to a sense node, and a selector terminal that is coupled to a threshold control node;
an amplifier circuit, wherein the amplifier circuit includes a first input that is coupled to the first node, a second input that is coupled to the load node, and an output that is coupled to a feedback node; and
a transistor circuit, wherein the transistor circuit includes a first terminal that is coupled to the first node, a second terminal that is coupled to the second node, and a control terminal that is coupled to the feedback node.

13. The apparatus of claim 12, wherein the switching circuit is arranged to provide a sense voltage to the sense node when the load current is supplied from the power source node to the load node through the external resistor.

14. The apparatus of claim 13, further comprising: a comparator circuit, wherein the comparator circuit includes an output that is coupled to a detection node, a first input that is coupled to a reference voltage node, and a second input that is coupled to the sense node, wherein the comparator is arranged to provide a detection signal at the detection node when the sense voltage approximately reaches a reference voltage that is associated with the reference voltage node.

15. The apparatus of claim 12, further comprising: a sense current (ISNS) that is provided to the second node by the first transistor when the load current is supplied from the power source node to the load node through the external resistor, such that the second node has an associated first sense voltage and the intermediary node has an associated second sense voltage that is different from the first sense voltage, and wherein the switching circuit is arranged to selectively couple one of the first sense voltage and the second sense voltage to the sense node.

16. The apparatus of claim 15, further comprising: a second resistance value (R2) that is associated with the second resistive circuit, a third resistance value (R3) that is associated with the third resistive circuit, and a sense voltage (VSNS) that is responsive to the sense current (ISNS) according to a voltage gain factor (G2) such that the sense voltage (VSNS) is given by: VSNS=ISNS*R3*G2, where G2 corresponds to at least one of 1 and (1+R2/R3).

17. The apparatus of claim 12, further comprising: a sense current (ISNS) that is provided to the second node by the first transistor when the load current (I0) is supplied from the power source node to the load node through the external resistor, a sense voltage (VSNS) that is provided to the sense node in response to the sense current (ISNS) via the switching circuit, a first resistance value (R1) that is associated with the first resistive circuit, a second resistance value (R2)

that is associated with the second resistive circuit, a third resistance value (R3) that is associated with the third resistive circuit, and a fourth resistance value (R0) that is associated with the external resistor, wherein the sense current (ISNS) is related to the load current according to a current gain factor (G1), and wherein the sense voltage (VSNS) is related to the sense current (ISNS) according to a voltage gain factor (G2), such that the overall system gain (G) is given by: G=I0*(R0/R1)*G1*G2*R3.

18. The apparatus of claim 17, wherein the current gain factor (G1) is determined by a transconductance parameter that is associated with the transistor circuit.

19. The apparatus of claim 17, wherein the voltage gain factor is determined by a position associated with the switching circuit such that the voltage gain factor is given by at least one of G2=1, and G2=(1+R2/R3).

20. An apparatus that is arranged to monitor a load current that is supplied from a power source node to a load node through an external resistor, the apparatus comprising:

a first resistive means that is coupled between the power source node and a first node, wherein the first resistive means is arranged to provide a representative current (I1) to the first node when the load current (I0) is supplied from the power source node to the load node through the external resistor;

a control means that is arranged to match a voltage drop across the resistive means to another voltage drop across the external resistor;

a current gain means that is arranged to provide a sense current (ISNS) in response to the representative current (I1) according to a current gain factor (G1);

a gain control means that is arranged to selectively lower the current gain factor (G1) in response to a current rate control signal (CR);

a second resistive means that is arranged to convert the sense current (ISNS) into a sense voltage (VSNS) according to a voltage gain factor (G2); and a threshold adjustment means that is arranged to adjust the voltage gain factor (G2) in response to a threshold control signal (TH).

* * * * *